United States Patent
Tani et al.

[11] Patent Number: 6,080,602
[45] Date of Patent: Jun. 27, 2000

[54] METHOD OF PRODUCING A SEMICONDUCTOR DEVICE USING A REDUCED MOUNTING AREA

[75] Inventors: Takayuki Tani; Takao Shibuya; Haruo Hyodo, all of Osaka, Japan

[73] Assignee: Sanyo Electric Co., Ltd., Osaka, Japan

[21] Appl. No.: 09/219,508

[22] Filed: Dec. 23, 1998

[30] Foreign Application Priority Data

Dec. 25, 1997 [JP] Japan ..................... 9-357466

[51] Int. Cl.$^7$ ..................... H01L 21/44
[52] U.S. Cl. ..................... 438/114; 438/33; 438/110; 438/112; 438/113; 438/123; 438/124; 438/127
[58] Field of Search ..................... 257/723, 738, 257/787, 676, 724, 692, 693; 438/113, 124, 126, 127, FOR 365, 371, 26, 33, 110, 111, 112, 114, 123; 29/840

[56] References Cited

U.S. PATENT DOCUMENTS

| | | | |
|---|---|---|---|
| 5,273,938 | 12/1993 | Lin et al. | 438/107 |
| 5,652,185 | 7/1997 | Lee | 438/113 |
| 5,731,231 | 3/1998 | Miyajima | 438/124 |
| 5,830,800 | 11/1998 | Lin | 438/459 |
| 5,832,600 | 11/1998 | Hashimoto | 29/841 |
| 5,882,949 | 3/1999 | Okazaki | 438/26 |

FOREIGN PATENT DOCUMENTS

| | | |
|---|---|---|
| 751561 | 1/1997 | European Pat. Off. . |
| 619636 | 12/1987 | Germany . |
| 7-240366 | 3/1997 | Japan . |
| 7-184323 | 7/1997 | Japan . |

*Primary Examiner*—Olik Chaudhuri
*Assistant Examiner*—Alonzo Chambliss
*Attorney, Agent, or Firm*—Wenderoth, Lind & Ponack, L.L.P.

[57] ABSTRACT

An object of the present invention is to provide a method of manufacturing a semiconductor device which enables a decrease in mounting area on a printed circuit board and an increase in space efficiency on the printed circuit board. The method of manufacturing a semiconductor device, comprises the steps of: (1) preparing a common substrate which has a plurality of unit portions for accommodating at least a semiconductor chip on each of the unit portions; (2) mounting at least a semiconductor chip on each of the unit portions; (3) supplying a thermosetting resin on a surface of the common substrate, the unit portions including semiconductor chips being covered with the thermosetting resin continuously, and hardening the thermosetting resin by heat treatment to form a solid resin body; (4) leveling the resin body on the common substrate for forming a level surface thereon; and (5) cutting the common substrate and resin body at each side of each unit portion for separating the unit portions into individual unit portions.

11 Claims, 5 Drawing Sheets

METHOD OF PRODUCING A SEMICONDUCTOR DEVICE USING A REDUCED MOUNTING AREA

BACKGROUND OF THE INVENTION

1. Field of the Invention

The present invention relates to a method of manufacturing a semiconductor device, and more particularly to a semiconductor device having decreased mounting area in a printed circuit board and increasing efficiency of mounting thereof

2. Description of the Related Art

Semiconductor devices such as an integrated circuit (IC) or discrete transistor device are manufactured by using a mounting technology as shown in FIG. 1A. Numerical reference 1 denotes a silicon substrate or silicon semiconductor chip, 2 denotes an island for fixing the semiconductor chip 1, 3 denotes a lead terminal, 4 denotes a bonding wire, and 5 denotes a resin body for enclosing the semiconductor chip 1.

A semiconductor chip 1 having, for example, an NPN-type transistor structure is fixed on the island 2 by using an adhesive 6 such as solder. Lead terminals 3 are electrically connected to a base electrode and an emitter electrode of the semiconductor chip 1 respectively by bonding wire 4. The island 2 is electrically connected to a collector electrode of the semiconductor chip 1.

After the semiconductor chip 1 is mounted on the island 2, the semiconductor chip 1 and a portion of the lead terminal 3 are encased by transfer molding in the molded resin case, which is made of thermosetting resin such as epoxy resin or the like, such that a semiconductor device having a three terminal structure is provided. The lead terminals 3 extending out of the epoxy resin body 5 are bent into Z shapes.

In the manufacturing process of the semiconductor device, island 2 and lead terminals 3 are provided on a lead frame of hoop or rectangle shape, which is made of copper material or iron material. One lead frame has sets of islands 2 and lead terminals 3 corresponding to, for example, 20 semiconductor devices.

As shown in FIG. 1B, an upper metal mold 10 and lower metal mold 11 form a space therebetween which is a cavity 9, and which defines a shape of resin body 5 of the semiconductor device. In the cavity 9, the semiconductor chip 1 which is fixed on the island 2 of the lead frame with bonding wires 4 connected to the lead terminals 3, is set therein, and encased by thermosetting resin which is injected by transfer molding. Afterward, the lead terminals are cut away from the lead frame, and the encased chips on the lead frame are separated into individual devices.

First problem to be solved:

A resin molded semiconductor device (electrical component) is usually mounted on a printed-circuit board such as a glass-epoxy printed-circuit board, and is connected to other electrical components by wiring on the printed-circuit board, thereby providing a circuit network for performing a desired function. However, a conventional semiconductor device has lead terminals 3 protruding out of the resin body 5 by a length L as shown in FIG. 1A. The protruding portion L of the lead terminal needs excess space for mounting the resin body of the semiconductor device on the printed circuit board.

Second problem to be solved:

The transfer molding technology for encasing the semiconductor chip involves injecting thermosetting resin into a space (cavity) formed between the upper metal mold and the lower metal mold. Conventionally, one cavity is prepared for encasing one semiconductor chip, and each cavity has its path for injecting the thermosetting resin therethrough on the surfaces of the metal molds. Encasing is carried out by injection of the resin such that the resin is filled in the cavity and the path. Usually, epoxy resin which is used for encasing the semiconductor chip has thermosetting characteristics and utilization of wasted material is difficult. Therefore, the resin which is hardened and which remains in the path connected to the cavity is wasted and not to be utilized again for the products. The amount of the wasted resin is often larger than the amount of the resin utilized for the product, especially in the manufacturing process of smaller packages of the semiconductor devices. It is thus a drawback that the utilization efficiency of the thermosetting resin is poor.

SUMMARY OF THE INVENTION

It is therefore an object of the present invention to provide a method of manufacturing a semiconductor device which enables a decrease in mounting area on a printed circuit board and an increase in space efficiency on the printed circuit board.

Another object of the present invention is to provide a method of manufacturing a semiconductor device which enables an increase in the utilization efficiency of the thermosetting resin to thereby reduce the cost in the manufacturing process of the semiconductor devices.

According to the present invention, there is provided a method of manufacturing a semiconductor device comprising the steps of: preparing a common substrate which has a plurality of unit portions for accommodating at least a semiconductor chip on each of the unit portions; mounting at least a semiconductor chip on each of the unit portions; supplying thermosetting resin onto a surface of the common substrate, the unit portions including semiconductor chips being covered with the thermosetting resin continuously, and hardening the thermosetting resin by heat treatment to form a solid resin body; leveling the resin body on the common substrate to form a level surface thereon; cutting the common substrate and resin body at each side of each unit portion to separate the individual unit portions from one another.

The above and other objects, features, and advantages of the present invention will become apparent from the following description when taken in conjunction with the accompanying drawings which illustrate a preferred embodiment of the present invention by way of example.

DETAILED DESCRIPTION OF THE PREFERRED EMBODIMENTS

Figure 2A:
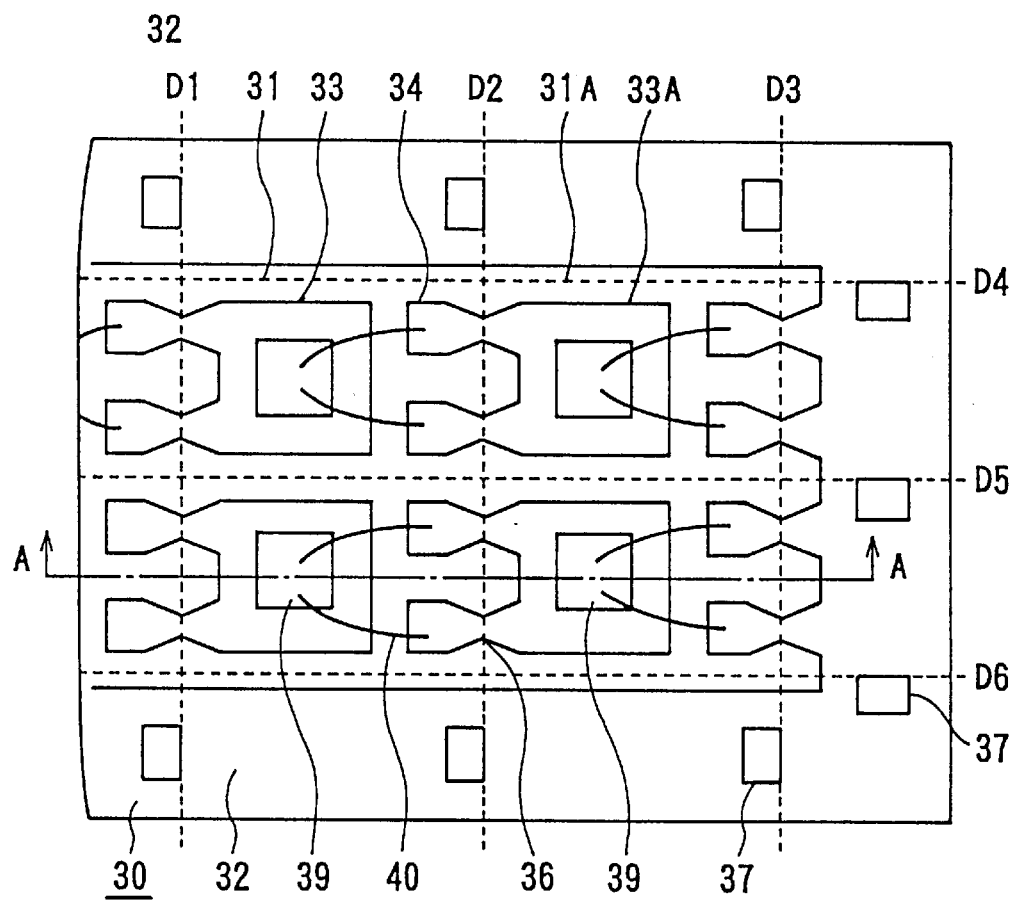
FIG. 2A is a plan view of a common substrate according to a ffirst embodiment of the present invention.
Figure 2B:
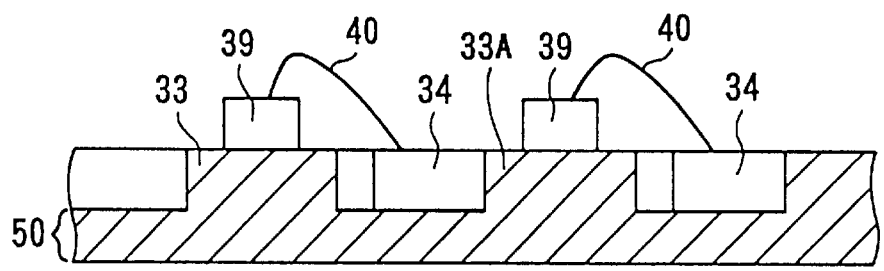
FIG. 2B is a cross sectional view taken along line A—A of FIG. 2A.

First step: FIGS. 2A and 2B show a common substrate 30.

A common substrate 30 is prepared, and a plurality of semiconductor chips 39 are mounted on islands 33 of the substrate 30 by die bonding. And, wires are connected between semiconductor chip 39 and lead terminals 34 of the substrate 30 by wire bonding. Here, common substrate 30 comprises of a metal lead frame according to the first embodiment of the present invention.

The common substrate 30 has many unit portions for mounting semiconductor chips 31, 31A . . . disposed as a repeated pattern like a matrix, or a line. The unit portions are retained by a frame portion 32 surrounding the unit portions 31, 31A.

The unit portion 31 is provided with at least an island 33 to which the semiconductor chip 39 is fixed, and lead terminals 34 which act as electrodes for connecting with outside circuits or an adjacent island 33A. A connecting portion between the island 33 and lead terminal 34, is formed to be narrow for forming a concave portion. Since the unit portions are disposed in a matrix of rows and columns in the rectangle lead frame, one sheet of common substrate 30 can accommodate for example a hundred unit portions therein.

In FIG. 2A, dotted lines D1 through D6 shows cutting lines where cutting is carried out in a later process, and the portions surrounded by the cutting lines define the unit portions 31, respectively.

The above mentioned common substrate 30 is obtained from a metal plate which has for example 0.4 mm thickness and is made of copper having a hoop-like or rectangle-like shape. And a lead frame pattern is obtained by etching with an etching depth of 0.2 mm. The backside of the metal plate where etching is not carried out is defined as a back plate 50. Also, the common substrate 30 may be made of a combination of a flat back plate 50 and a lead frame having the same pattern as shown in FIG. 2A, which are adhered with each other.

Next, die bonding and wire bonding processes are carried out. On a surface of each island 33, 33A, electrically conductive paste such as silver paste or solder paste is applied, and a semiconductor chip is put on to the island and fixed thereto by the paste. Afterward, wires 40 are bonded between bonding pads on the semiconductor chip 39 and corresponding lead terminals 34. Wire 40 comprises of gold wire which has, for example, a 20 µm diameter. Here, the wire 40 connects a surface electrode on a semiconductor chip 39 on an island 33 to lead terminals 34 which are extending from an adjacent island 33A.

The backside of the island 33 where the semiconductor chip 39 is fixed, is available to electrically connect to outside circuits as an electrode. The backside of an island is preferably utilized as an electrode of the semiconductor device which has vertical current paths like transistors and power MOSFETS.

Figure 3A:
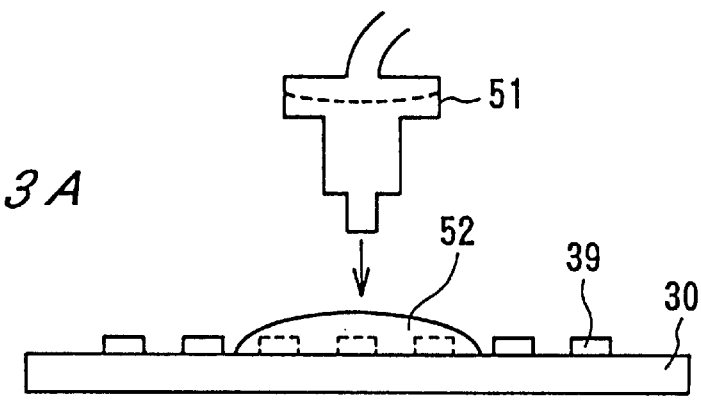
FIGS. 3A through 3E are cross-sectional views illustrative of a method of the present invention.
Figure 3B:
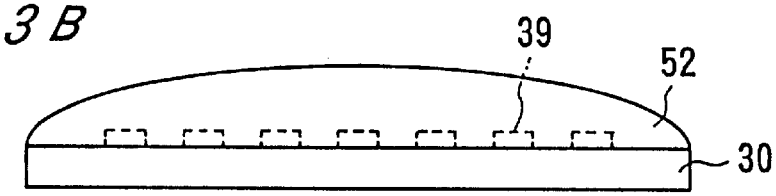

Second step: FIGS. 3A and 3B show a manufacturing process of encasing.

Figure 3C:
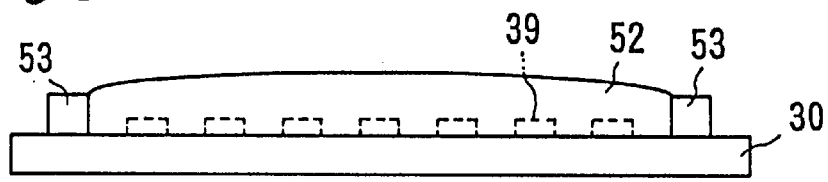

Next, encasing with thermosetting resin all over the common substrate is carried out. After the die bonding process and wire bonding process are finished, the common substrate 30 is put on a table (not shown), and an amount of liquid thermosetting resin 52 is delivered thereon by dispenser 51 by potting. The liquid resin 52 is, for example, CV576 AN (produced by Matsushita Denko). As delivered liquid resin has a surface tension, when the liquid resin 52 is delivered to the surface of the common substrate 30, the liquid resin 52 tends to form a curved surface as shown in FIG. 3B. The liquid resin 52 covers over all of the semiconductor chips 39 not individually, but commonly as shown in FIG. 3B. Furthermore, as shown in FIG. 3C, a circular dam 53 may be equipped on the periphery of the common substrate 30 where the dam 53 has a height of several millimeters and a width of several millimeters. Then, liquid resin 52 may be filled inside of the dam 53 with a relatively flat surface curvature.

After the semiconductor chips are covered with liquid resin 52, the resin 52 is hardened by heat curing treatment at 100–200° C. for several hours.

Figure 3D:
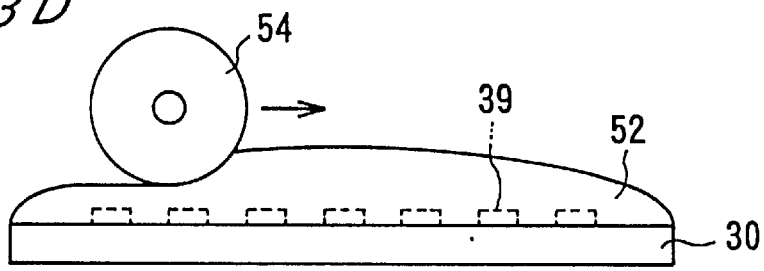

Third step: FIG. 3D shows a manufacturing process of leveling. Next, the curved surface of the resin body 52 is cut away to form a flat surface. Namely, dicing blade 54 is used to cut away the body resin 52, so as to form a flat surface of the resin 52 which has the same height over the surface of the common substrate 30. The surface of the resin body 52 has to be leveled so as to have sufficient thickness (height) for satisfying the package standards when the common substrate 30 and resin body 52 are divided into individual semiconductor devices. As to the above mentioned dicing blade, various kinds of blade, are available. By selecting a proper kind of the blade, it is possible to make a sufficiently precise flat surface of the resin body 52 after repeating the cutting several times. Furthermore, instead of using the dicing blade, it is possible to obtain the flat surface by using a grinding machine with an abrasive surface.

Figure 3E:
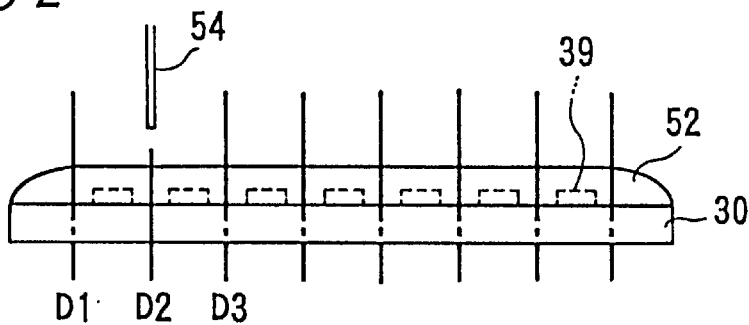

Fourth step: FIG. 3E shows a manufacturing process of separating.

Next, unit portions are separated by cutting of the resin body 52 so as to produce semiconductor devices A, B, C . . . .

Before separation by cutting, in the case of using a common substrate as shown in FIGS. 2A and 2B, the back plate 50 should be removed before cutting. In the case of using an independent back plate 50 which is adhered to the lead frame, the back plate 50 is removed from the lead frame so as to expose the back faces of the islands and lead terminals. In the case of the common substrate being made of a metal plate by half etching, the lower portion corresponding to the back plate 50 should be removed so as to expose the back faces of the islands and lead terminals to be seen visually. It is possible to remove the corresponding back plate portion by using the dicing machine with a dicing blade, by etching, by using the grinding machine with an abrasive surface and so on.

Afterward, by cutting along the lines D1–D6 which surround the unit portions each having an island and lead terminals where the semiconductor chip 39 is mounted, semiconductor devices are produced to have the encased semiconductor chip 39 and lead terminals.

As to cutting, a dicing machine is used to cut the resin body 52 and common substrate 30 at the same time with the blade of the dicing machine. By cutting along the lines D1–D3, opposite portions of the lead terminals 34 remain as projecting portions of the island 33A. The cut surface of the lead terminal 34 and projecting portion form a single surface with the cut surface of resin 52 and is exposed in the cut surface of the resin 52. At the manufacturing step of dicing, a blue sheet (for example, a product called a "UV Sheet", produced by Lintec corporation) is adhered to the backside of the common substrate, and the dicing blade cuts the common substrate with a cutting depth so as to reach the blue sheet. Alignment marks disposed on the frame portion are automatically recognized by the dicing machine, and the dicing is carried out by utilizing the alignment marks as reference positions.

Furthermore, dicing is carried out so as to cut the concave portion 36 of the lead terminal 33 exactly by the blade running thereon. Accordingly, the lead terminal 34 is formed tapered to be smaller at the cut surface in the resin body 52, to prevent it from easily falling out of the surrounding resin.

Figure 4:
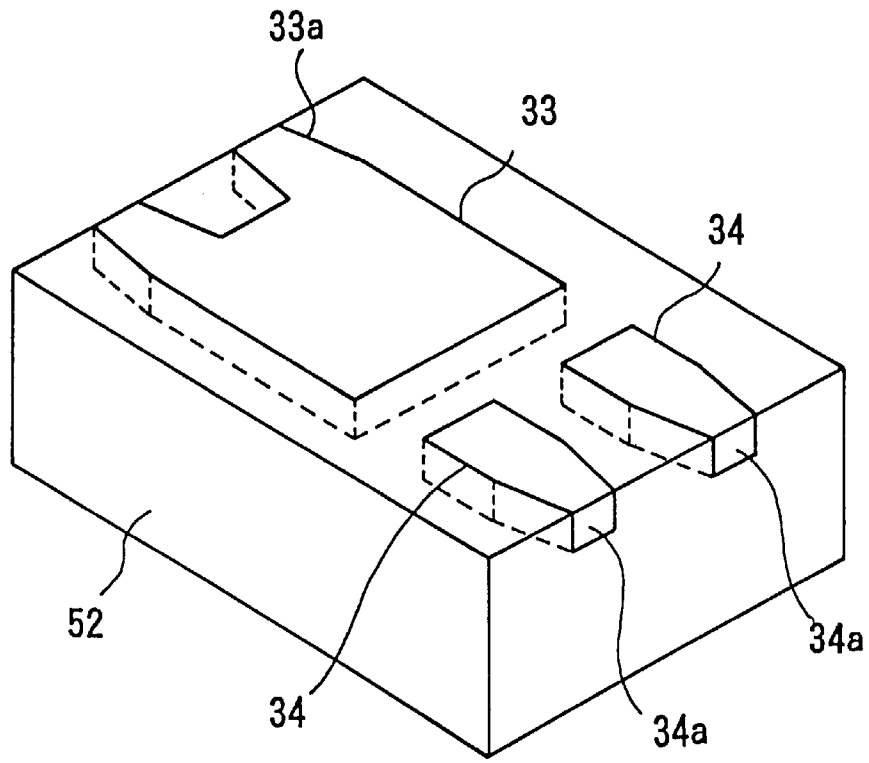
FIG. 4 is a perspective view of a semiconductor device according to the first embodiment of the present invention.

FIG. 4 shows a completed semiconductor device perspectively in which the back face of the device is seen at upper surface. The semiconductor device comprises an almost rectangular shaped resin package in which island 33 and lead terminals 34 are exposed on the back face and side faces. The semiconductor chip 39 and bonding wire 40 are encased by resin body 52. The dimensions of the resin package 52 are about 0.7 mm in length×1.0 mm in width× 0.6 mm in height.

The resin body 52 has four faces which are cut away therefrom out of six faces of a rectangular parallelepiped (refer to the fourth step). The cut surface 34a of lead terminal 34 is exposed on the cut surface of the resin body 52. The island 33 has protruding portions 33a which are formed of a portion cut out from the lead terminal 34 of the opposite side surface of the protruding portion 33a is also exposed at the cut surface (side face) of the resin body 52. The reverse faces of the island 33 and lead terminal 34 are also exposed on the reverse face (lower face) of the resin body.

The semiconductor device is mounted on a printed-circuit board by soldering. A chip mounter which mounts the semiconductor device automatically on the printed-circuit board, draws and holds the semiconductor device using a vacuum collet, carries it to a desired position on the printed-circuit board, and fixes it thereto by soldering. At this time, the upper face which is opposite to a face where the island and lead terminal are exposed, is drawn and held by the vacuum collet. Therefore, the upper face of the semiconductor device should have a surface which has dimensions and accuracy for satisfying industry standards of surface mounting technology. According to the present invention, since the upper surface of the resin body 52 is leveled by the leveling process (third step), the upper surface is maintained flat to satisfy the dimensions and accuracy, and the operability of the automatic mounting is maintained.

Figure 5:
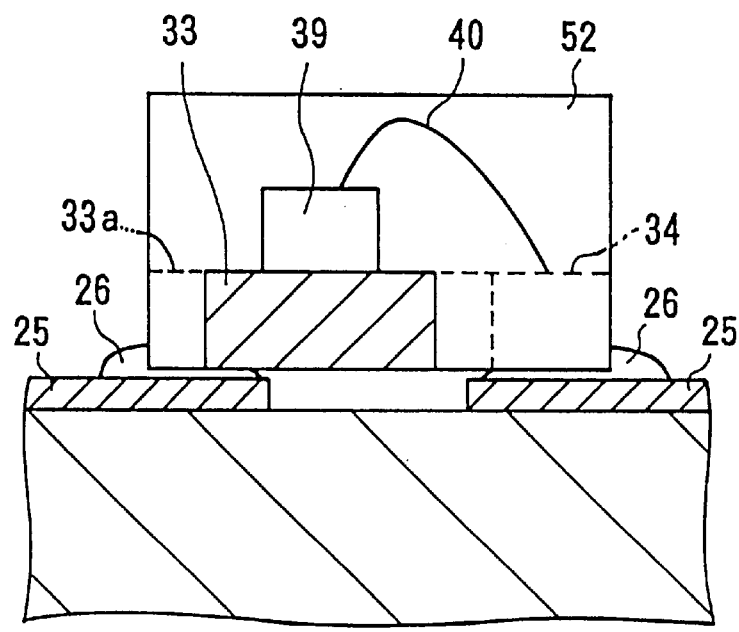
FIG. 5 is a cross-sectional view of the semiconductor device mounted on a printed-circuit board according to the first embodiment of the present invention.

FIG. 5 shows the semiconductor device which is mounted on the printed-circuit board. The lead terminal 34 and protruding portion 33a of the island 33 which are exposed on the lower face of the resin body 52, are aligned with printed wiring 25 on the printed-circuit board, and are fixed by solder 26 therto.

The second embodiment of the present invention will be described as follows referring to FIGS. 6A and 6B.

In the first embodiment of the present invention, a metal lead frame was utilized as a common substrate; however, in the second embodiment, an insulative substrate such as a substrate of ceramics or glass-epoxy is utilized for supporting semiconductor chips thereon.

Figure 6A:
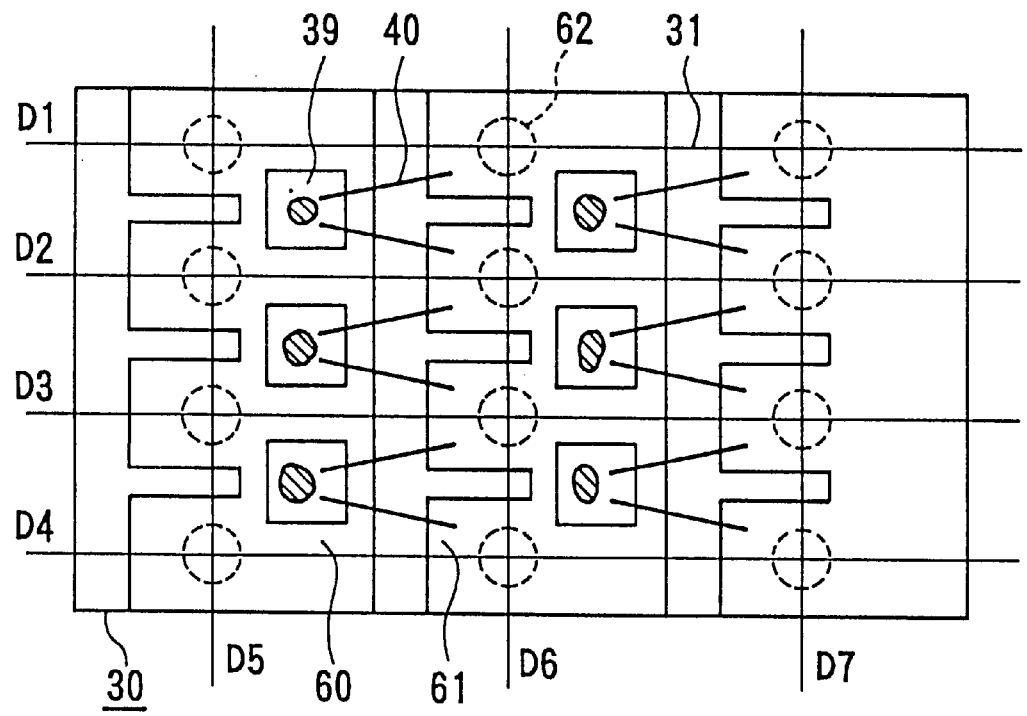
FIGS. 6A and 6B are views similar to FIGS. 2A and 2B but showing a second embodiment of the present invention.

FIG. 6A shows a plan-view where a semiconductor chip 39 is mounted on a prepared common substrate 30 by die bonding and wire bonding.

Conductive patterns of gold plating are formed on the common substrate 30, and the lines D1–D7 are shown as cutting lines for separating the common substrate into individual devices, when cutting is carried out. Rectangular areas surrounded by the cutting lines D1–D7 constitute unit portions for respectively accommodating a semiconductor chips.

The gold plating pattern has areas which comprise island portions 60 on which the semiconductor chips 39 are mounted, and terminal lead portions 61 where bonding wires 40 are bonded as second bonding areas.

The island portion 60 and lead portion 61 are not continuous but separated by a unit area 31, and the island portion 60 and lead portion 61 are continuous across the lines D1 through D7 in the area between the unit areas 31. Furthermore, at the intersections of the cutting lines D1–D7 which correspond to the four corners of the unit areas 31, a through hole 62 is formed through the common substrate 30. The through hole 62 is connected to a conductive pattern which is formed on the reverse surface (lower face) of the substrate to constitute a surface electrode after the semiconductor device is completed. By the through hole 62, island portion 60 and lead portion 61 are electrically connected to surface electrodes which are formed on the lower surface of the device.

All of the semiconductor chips on the common substrate 30 are covered by liquid thermosetting resin by a potting process, and the liquid resin is hardened to form a solid resin body in a heat curing treatment. Then, the resin body is planarized by a leveling process. Then, the common substrate with the resin body is cut along the lines D1–D7 by a cutting process, and divided into individual unit portions, namely, semiconductor devices as shown in FIG. 6B. The above processes are the same as those described in the first embodiment.

Figure 6B:
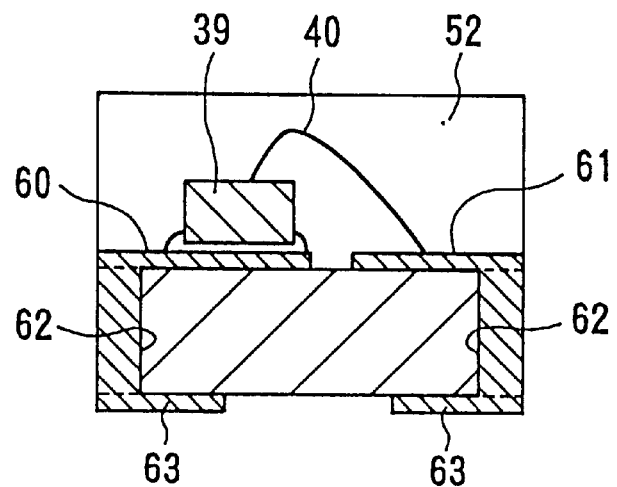

FIG. 6B shows a sectional view of one completed semiconductor device, and the same reference numerals are used for similar portions of the semiconductor devices in other drawings to avoid repetitive explanations. Concerning this embodiment of the present invention, the island portion 60 and the lead terminal portion 61 on the upper face of the common substrate 30 and a surface electrode 63 on the lower face of the resin body are connected with each other via the through hole 62. The surface electrode 63 comprises of a gold plated conductive pattern, and will be connected to wiring on a printed circuit board by soldering as described in the first embodiment.

Figure 1A:
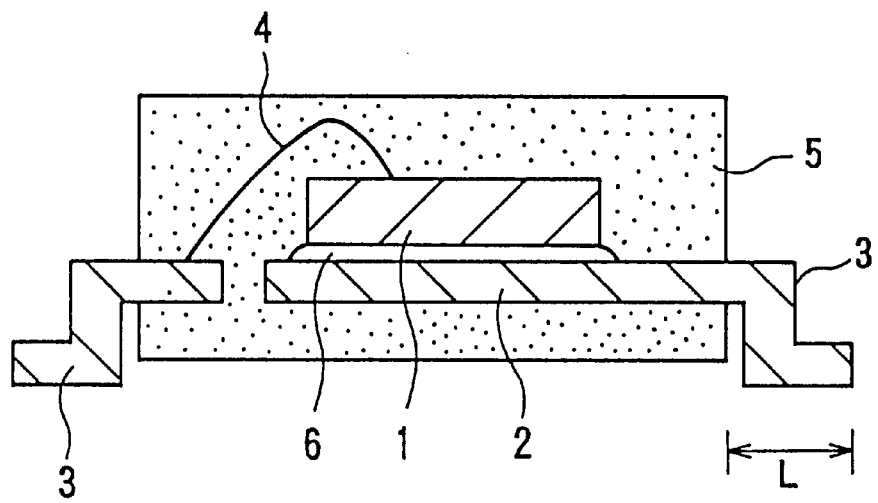
FIGS. 1A and 1B are cross-sectional views of a conventional semiconductor device.
Figure 1B:
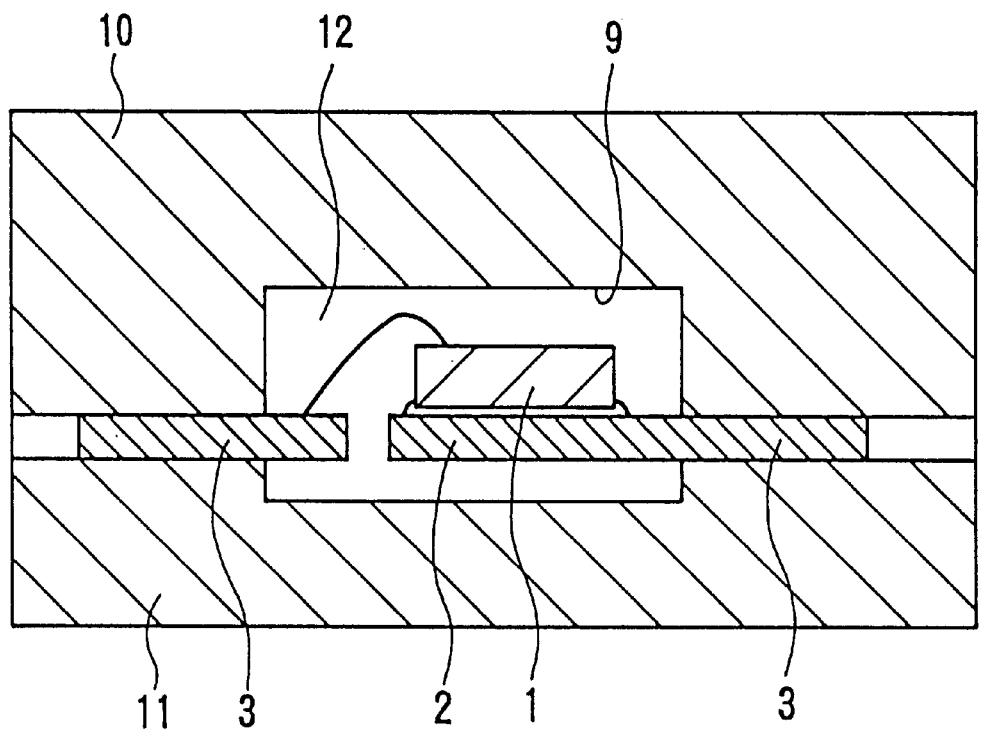

The above-mentioned semiconductor devices have the following advantages. First, since the metal lead terminal does not protrude from the face of the package, the mounting area is decreased to a size nearly same as the package. Accordingly, effective mounting area which is a ratio of active area (chip size of the semiconductor chip 39) to mounting area, is greatly increased, as compared with conventional semiconductor devices as shown in FIG. 1. Therefore, the invention contributes to reduction in size and weight of the electronic devices.

Second, the amount of wasted resin material is reduced, as compared with packaging individually by using transfer molding technology, in which the devices are encased one by one, and it leads to reduction of manufacturing costs.

Third, since the package has faces which are cut by dicing blades, the dimensional accuracy of the package is improved, thereby enabling manufacture of smaller—sized packages of semiconductor devices with high precision. This means that the relative size of the island 33 can be increased when a lead frame is utilized as the common substrate 30. Namely, conventional alignment accuracy of a metal mold to a lead frame by transfer molding technology is ±50 μm. In contrast, according to this invention, the alignment accuracy of the dicing blade to the lead frame using a dicing machine is ±10 μm. Therefore, alignment accuracy is improved according to the embodiments of the present invention, and this means that areas where the semiconductor chips are mounted are made larger by increasing the island 33 areas, thereby leading to improved effective mounting area efficiency.

Concerning the above-mentioned embodiments, semiconductor devices which have three terminals are illustrated and described as examples. However, the present invention is applicable to semiconductor devices which have more than three terminals. Also, concerning the above-mentioned embodiments, it has been explained that one semiconductor chip 39 is mounted on one island. However, more than one semiconductor chip may be mounted on one island. For example, several chips of transistors, a combination of a transistor and a vertical power MOSFET, or other combinations of plural chips may be mounted on one island.

Furthermore, the invention is also applicable to semiconductor devices of not only transistor type, but also to power MOSFET, IGBT, HBT and so on. Further, the invention is also applicable to integrated circuits of bipolar or MOS type by increasing the number of terminals of the semiconductor devices.

Although certain preferred embodiments of the present invention have been shown and described in detail, it should be understood that various changes and modifications may be made therein without departing from the scope of the appended claims.

What is claimed is:

1. A method of manufacturing semiconductor devices, comprising:

preparing a common substrate comprising a plurality of unit portions such that each unit portion includes an island portion and lead terminals separated from said island portion, and such that the lead terminals of each one of said unit portions are continuous with the island portion of an adjacent unit portion;

mounting a semiconductor chip on the island portion of each one of said unit portions, and connecting wires between the semiconductor chip and the lead terminals of each of said unit portions;

supplying resin material onto a surface of said common substrate so as to form a resin body covering said semiconductor chips and said wires;

leveling said resin body to form a flat surface thereof and such that said resin body remains covering said semiconductor chips and said wires; and cutting said common substrate and said resin body along edges of said unit portions in such a manner as to divide each of said island portions from the lead terminals that are continuous therewith, so as to separate said unit portions to thereby form a plurality of semiconductor devices.

2. A method according to claim 1, wherein
   said supplying of resin material onto the surface of said common substrate comprises supplying thermosetting resin material onto the surface of said common substrate.

3. A method according to claim 1, further comprising
   providing bonding pads on each of said semiconductor chips; and
   wherein said connecting of wires between the semiconductor portion and the lead terminals of each of said unit portions comprises connecting the wires to the bonding pads of said semiconductor chips.

4. A method according to claim 1, wherein
   said supplying of resin material onto the surface of said common substrate involves supplying said resin material so that said resin material continuously covers said unit portions together with said semiconductor chips.

5. A method according to claim 1, wherein said common substrate comprises a metal lead frame.

6. A method according to claim 1, wherein said common substrate comprises an insulative substrate.

7. A method according to claim 1, wherein said leveling of said resin body is carried out with a dicing blade.

8. A method according to claim 1, wherein
   said cutting of said common substrate and said resin body is carried out with a dicing blade.

9. A method according to claim 1, wherein
   after said cutting of said common substrate and said resin body along edges of said unit portions in such a manner as to divide each of said island portions from the lead terminals that are continuous therewith, cut edges of said lead terminals are exposed at cut edges of said resin body.

10. A method according to claim 1, wherein
    after said cutting of said common substrate and said resin body along edges of said unit portions in such a manner as to divide each of said island portions from the lead terminals that are continuous therewith, cut edges of said lead terminals are exposed at cut edges of said resin body, and cut edges of said island portions are exposed at cut edges of said resin body.

11. A method according to claim 1, wherein
    after said cutting of said common substrate and said resin body along edges of said unit portions in such a manner as to divide each of said island portions from the lead terminals that are continuous therewith, cut edges of said lead terminals are exposed at first cut edges of said resin body, and cut edges of said island portions are exposed at second cut edges of said resin body different than said first cut edges.

* * * * *